(12) United States Patent
Muto et al.

(10) Patent No.: US 10,121,640 B2
(45) Date of Patent: Nov. 6, 2018

(54) METHOD AND APPARATUS FOR PLASMA PROCESSING

(71) Applicant: HITACHI HIGH-TECHNOLOGIES CORPORATION, Tokyo (JP)

(72) Inventors: Satoru Muto, Kudamatsu (JP); Tetsuo Ono, Kudamatsu (JP); Yasuo Ohgoshi, Kudamatsu (JP); Hirofumi Eitoku, Kudamatsu (JP)

(73) Assignee: HITACHI HIGH-TECHNOLOGIES CORPORATION, Tokyo (JP)

( * ) Notice: Subject to any disclaimer, the term of this patent is extended or adjusted under 35 U.S.C. 154(b) by 345 days.

(21) Appl. No.: 14/603,187

(22) Filed: Jan. 22, 2015

(65) Prior Publication Data

US 2015/0170880 A1 Jun. 18, 2015

Related U.S. Application Data

(63) Continuation of application No. 13/960,831, filed on Aug. 7, 2013, now Pat. No. 8,969,211.

(30) Foreign Application Priority Data

Apr. 9, 2013 (JP) ................................ 2013-080901

(51) Int. Cl.
*C23C 16/00* (2006.01)
*C23F 1/00* (2006.01)
(Continued)

(52) U.S. Cl.
CPC .. *H01J 37/32137* (2013.01); *H01J 37/32082* (2013.01); *H01J 37/32146* (2013.01);
(Continued)

(58) Field of Classification Search
CPC .......... H01J 37/32137; H01J 37/32715; H01J 37/32532; H01J 37/32082;
(Continued)

(56) References Cited

U.S. PATENT DOCUMENTS 6,589,437 B1 * 7/2003 Collins ................ H01J 37/321
216/67
2004/0238490 A1 12/2004 Sumiya et al.
(Continued)

FOREIGN PATENT DOCUMENTS

CN 101853763 A 10/2010
CN 102157325 A 8/2011
(Continued)

OTHER PUBLICATIONS

Machine Translation JP 2000-082596, Hyashi et al dated Mar. 2000.*
(Continued)

*Primary Examiner* — Rakesh K Dhingra
(74) *Attorney, Agent, or Firm* — Baker Botts L.L.P.

(57) ABSTRACT

The present invention provides a plasma processing method that uses a plasma processing apparatus including a plasma processing chamber in which a sample is plasma processed, a first radio-frequency power supply that supplies a first radio-frequency power for generating plasma, and a second radio-frequency power supply that supplies a second radio-frequency power to a sample stage on which the sample is mounted, wherein the plasma processing method includes the steps of modulating the first radio-frequency power by a first pulse; and controlling a plasma dissociation state to create a desired dissociation state by gradually controlling a duty ratio of the first pulse as a plasma processing time elapses.

11 Claims, 6 Drawing Sheets

(51) Int. Cl.
*H01L 21/306* (2006.01)
*H01J 37/32* (2006.01)
*H01L 21/3065* (2006.01)
*H01L 21/67* (2006.01)
*H01L 21/311* (2006.01)
*H01L 21/3213* (2006.01)
*H01L 29/66* (2006.01)

(52) U.S. Cl.
CPC .. *H01J 37/32165* (2013.01); *H01J 37/32532* (2013.01); *H01J 37/32715* (2013.01); *H01L 21/3065* (2013.01); *H01L 21/31116* (2013.01); *H01L 21/32137* (2013.01); *H01L 21/67069* (2013.01); *H01J 2237/334* (2013.01); *H01L 29/66795* (2013.01)

(58) Field of Classification Search
CPC .......... H01J 37/32165; H01J 37/32146; H01J 2237/334; H01L 21/32137; H01L 21/31116; H01L 21/67069; H01L 21/3065; H01L 29/66795
USPC ............... 118/723 MW; 156/345.24–345.28, 156/345.41
See application file for complete search history.

(56) References Cited

U.S. PATENT DOCUMENTS

| | | |
|---|---|---|
| 2010/0248489 A1 | 9/2010 | Koguchi et al. |
| 2011/0031216 A1 | 2/2011 | Liao et al. |
| 2012/0052689 A1 | 3/2012 | Tokashiki |
| 2013/0029492 A1 | 1/2013 | Inoue et al. |
| 2014/0305905 A1 | 10/2014 | Yamada et al. |

FOREIGN PATENT DOCUMENTS

| | | |
|---|---|---|
| JP | 2-312227 | 12/1990 |
| JP | H08-088218 A | 4/1996 |
| JP | H-09185999 | 7/1997 |
| JP | H-09213686 | 8/1997 |
| JP | H11-026433 A | 1/1999 |
| JP | 2000-082596 A | 3/2000 |
| JP | 2009-239054 | 10/2009 |
| JP | 2011-525682 A | 9/2011 |
| JP | 2013-030521 A | 2/2013 |
| JP | 2013-122966 A | 6/2013 |
| KR | A-10-2012-22251 | 3/2012 |
| TW | 201118943 A | 6/2011 |
| TW | 201207883 A | 2/2012 |

OTHER PUBLICATIONS

TW Office Action dated Dec. 24, 2014 in TW Patent Application No. 102121544 (Partial English translation).

Office Action, dated Jan. 14, 2016, which issued during the prosecution of Chinese Patent Application No. 201310330382.X, which corresponds to the present application.

Notification of Reasons for Refusal, dated May 24, 2016, which issued during the prosecution of Japanese Patent Application No. 2013-080901, which corresponds to the present application (English translation attached).

Office Action in Korean Patent Application No. 2013-93845, dated Jul. 31, 2014 (in Korean, 6 pages), [Partial English language translation, 1 page].

\* cited by examiner

METHOD AND APPARATUS FOR PLASMA PROCESSING

CROSS-REFERENCE TO RELATED APPLICATION

This application is a continuation of U.S. patent application Ser. No. 13/960,831, filed on Aug. 7, 2013, which is incorporated by reference herein in its entirety.

BACKGROUND OF THE INVENTION

The present invention relates to a method and an apparatus for plasma processing for a semiconductor device, and more particularly to a method and an apparatus for plasma processing in which plasma is pulse-modulated to increase the precision of plasma processing.

As semiconductor devices are miniaturized to smaller and smaller sizes, three-dimensional structure transistors, called Fin Field Effect Transistors (hereinafter called Fin-FET), are mass-produced today on a commercial basis. To respond to the mass production of three-dimensional structure transistors, the dry etching technology, a key to micro-fabrication, requires higher-level micro-fabrication, higher-aspect-ratio, and higher-precision etching for a complex profile not found in the conventional two-dimensional transistors. To meet this need, a breakthrough technology is required.

A processing profile, such as an aspect ratio, changes over time during etching, and each profile has the optimal etching condition. However, in many conventional etching methods, the condition is not changed according to a change in the profile.

One of the conventional technologies for changing conditions during etching is disclosed, for example, in JP-A-2009-239054. The disclosed method for manufacturing a silicon structure includes a first electric power application process wherein, in a process for etching a silicon substrate by using plasma generated by alternately introducing an etching gas and an organic sediment producing gas, applied power to a substrate when introducing the etching gas is kept constant during a predetermined time from the start of the etching, and a second electric power application process, wherein the applied power to the substrate at the introducing of the etching gas is increased with time, after the predetermined time has elapsed.

JP-A-2-312227 discloses a technology for dividing the etching period of a sample 11 into two. In the first half (several tens of seconds), high electron-temperature etching (mode 1) is performed using pulse discharge.

In the second half (several seconds to 20 seconds), usual low-damage etching (mode 2) is performed.

SUMMARY OF THE INVENTION

The technology disclosed in JP-A-2009-239054 is intended for micro machining, called a micro electro mechanical system (hereinafter called MEMS), that is performed under control of size precision of several-micron order. Therefore, the technology cannot be applied to the gate processing of a transistor that requires precision at the level of 10 nm.

The technology disclosed in JP-A-2-312227 is intended for increasing the etching rate and, therefore, the technology does not take into consideration the precision that is changed over time and the stability of discharge, that is, the range in which the power is changed. More specifically, when the power applied to plasma is changed, the plasma flickers and becomes unstable at some value or the characteristics such as the etching rate becomes discontinuous before and after some value. This is because, when the applied power is changed, the plasma density is changed and, as a result, the conduction mode of electromagnetic waves is changed or the electric field distribution in the plasma is changed.

In addition, the technology for continuously changing the applied power during etching assumes that the characteristics, such as the etching rate, change continuously to some extent. Therefore, a discontinuous change makes it difficult to control the operation properly and, as a result, a desired processing profile is not produced.

It is an object of the present invention to provide an etching technology for 10 nm-level micro-fabrication. In addition, the present invention aims to ensure the stability of etching to realize reproducible micro-fabrication. In view of the foregoing, it is another object of the present invention to provide a plasma processing method and a plasma processing apparatus capable of performing desired plasma processing by gradually changing the plasma dissociation state as the plasma processing time elapses.

According to an aspect of the present invention, there is provided with a plasma processing method that uses a plasma processing apparatus including a plasma processing chamber in which a sample is plasma processed, a first radio-frequency power supply that supplies a first radio-frequency power for generating plasma, and a second radio-frequency power supply that supplies a second radio-frequency power to a sample stage on which the sample is mounted, the plasma processing method including the steps of:

modulating the first radio-frequency power by a first pulse; and controlling a plasma dissociation state to create a desired dissociation state by gradually controlling a duty ratio of the first pulse as a plasma processing time elapses.

According to an aspect of the present invention, there is provided with a plasma processing apparatus including a plasma processing chamber in which a sample is plasma processed; a first radio-frequency power supply that supplies a first radio-frequency power for generating plasma; a first pulse generator that generates a first pulse for modulating the first radio-frequency power; a second radio-frequency power supply that supplies a second radio-frequency power to a sample stage on which the sample is mounted, and a second pulse generator that generates a second pulse for modulating the second radio-frequency power, the plasma processing apparatus including:

a first on/off signal generator that generates a signal for controlling on and off of the first radio-frequency power supply; and a second on/off signal generator that generates a signal for controlling on and off of the second radio-frequency power supply, wherein when the first radio-frequency power supply receives the off signal via the first on/off signal generator during an on period of the first pulse, the first radio-frequency power supply stops a supply of the first radio-frequency power.

According to the present invention, desired plasma processing can be performed by gradually changing the plasma dissociation state as the plasma processing time elapses.

Other objects, features and advantages of the invention will become apparent from the following description of the embodiments of the invention taken in conjunction with the accompanying drawings.

DETAILED DESCRIPTION OF THE EMBODIMENTS

Figure 1:
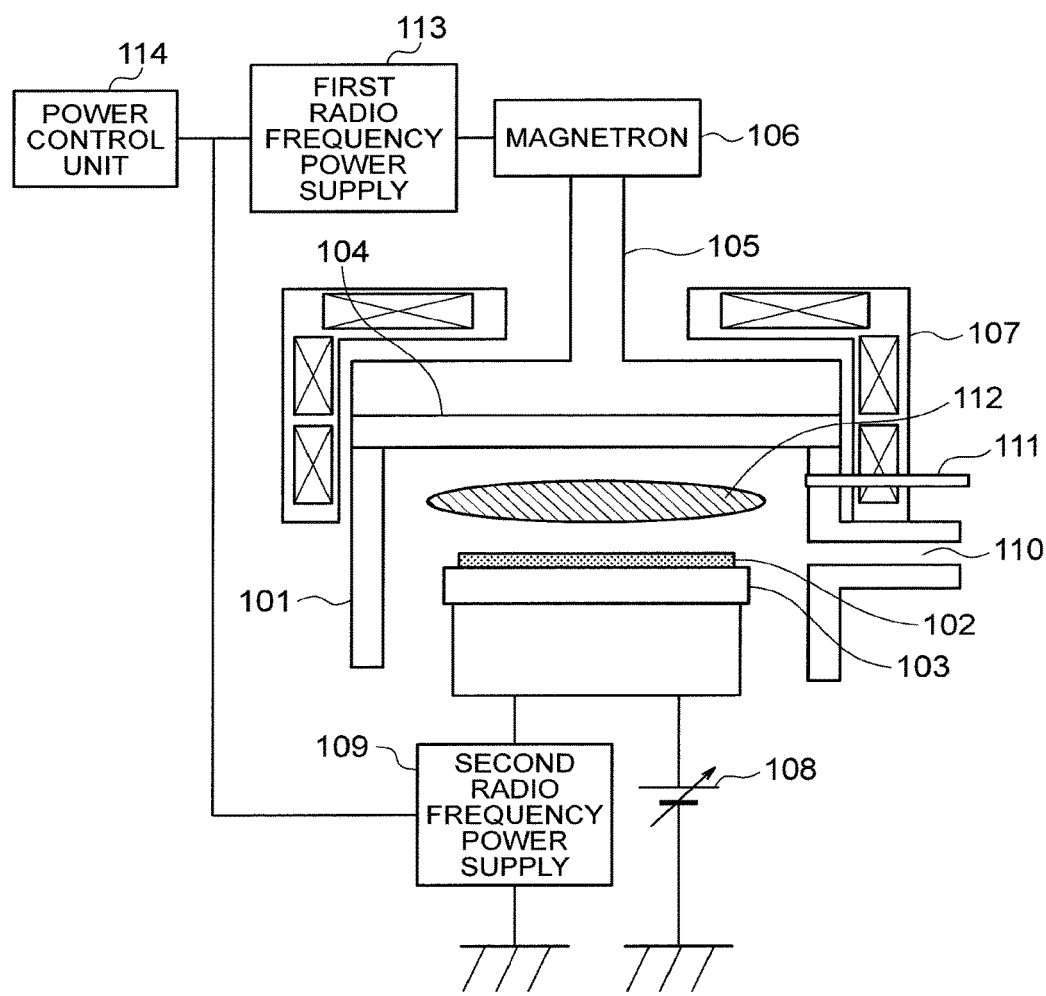
FIG. 1 is a diagram showing the general cross section of an example of a plasma etching apparatus for performing a plasma processing method of the present invention.

First, an example of a plasma etching apparatus for carrying out the present invention is described with reference to the drawings. FIG. 1 is a diagram showing the general configuration of an Electron Cyclotron Resonance (hereinafter called ECR) type plasma etching apparatus that uses a microwave and a magnetic field for plasma generation means.

The ECR type plasma etching apparatus, which is a plasma processing chamber, includes a chamber 101 the inside of which can be evaluated, a sample stage 103 on which a wafer 102 that is a sample is mounted, a microwave passing window 104 made of quartz and provided on the top of the chamber 101, a waveguide 105 provided on the microwave passing window 104, a magnetron 106 that oscillates microwaves, a first radio-frequency power supply 113 that supplies radio-frequency power to the magnetron 106, solenoid coils 107 provided around the chamber 101, an electrostatic chuck power supply 108 connected to the sample stage 103, and a second radio-frequency power supply 109.

After loaded into the chamber 101 from a wafer loading entrance 110, the wafer 102 is electrostatically chucked onto the sample stage 103 by the electrostatic chuck power supply 108. Next, process gas is introduced into the chamber 101 via a gas introduction entrance 111. The chamber 101 is evacuated by a vacuum pump (not shown) with the pressure adjusted to a predetermined pressure (for example, 0.1 Pa to 50 Pa). Next, the first radio-frequency power supply 113 supplies a radio-frequency power to the magnetron 106 to cause it to oscillate a microwave at a frequency of 2.45 GHz. This microwave is propagated within the chamber 101 via the waveguide 105. In this case, the first radio-frequency power supply 113 can supply a continuous radio-frequency power or a time-modulated radio-frequency power to the magnetron 106.

The combined operation between the microwave and the magnetic field generated by the solenoid coils 107 excite the process gas to form plasma 112 in the space above the wafer 102. On the other hand, the second radio-frequency power supply 109 applies a bias to the sample stage 103 to cause ion, included in the plasma 112, to be accelerated vertically to, and implanted into, the wafer 102. The second radio-frequency power supply 109 can apply a continuous bias power or a time-modulated bias power to the sample stage 103. Through the operation of the radical and the ion from the plasma 112, the wafer 102 is etched in an anisotropic manner.

Figure 2:
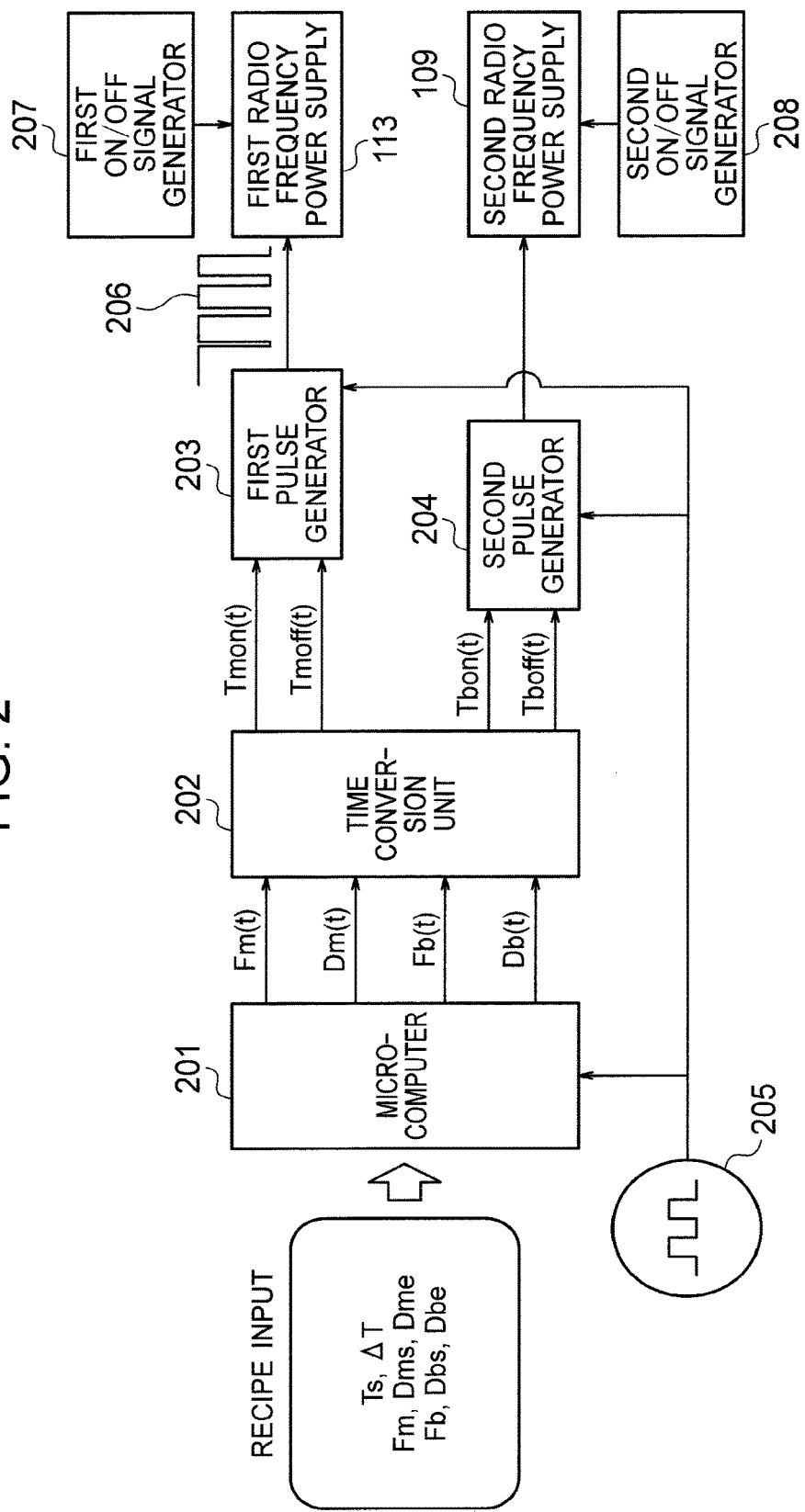
FIG. 2 is a block diagram showing a power control unit.

The plasma generation power or the wafer bias power is controlled by a power control unit 114. FIG. 2 shows the configuration of the power control unit 114. A plasma etching condition (hereinafter called a recipe) is input to a microcomputer 201. A recipe for the time control of power includes the following: etching time Ts, temporal change increment ΔT, microwave pulse modulation frequency Fm and its start-time duty ratio Dms, etching end-time duty ratio Dme, bias pulse modulation frequency Fb, its start-time duty ratio Dbs, pulse rate and duty ratio of etching end-time duty ratio Dbe.

From the received recipe, the microcomputer 201 calculates the temporal change Dm(t) in the duty ratio of the pulse-modulated microwave and the temporal change Db(t) in the duty ratio of the pulse-modulated bias. The temporal change, which may be changed by any function such as a multidimensional expression or an exponential function, is usually changed by a linear expression. That is, the temporal change may be controlled simply by an increase or a decrease in proportion to the time.

Next, a time conversion unit 202 converts the temporal change in the duty ratio of the microwave Dm(t) to the value of a time during which the microwave is on Tmon(t) and the value of a time during which the microwave is off Tmoff(t), and converts the temporal change in the duty ratio of the bias Db(t) to the value of a time during which the bias is on Tbon(t) and the value of a time during which the bias is off Tboff(t). Tmon(t) and Tmoff(t) are sent to a first pulse generator 203, and Tbon(t) and Tboff(t) are sent to a second pulse generator 204.

The first pulse generator 203 generates a signal, which is used to pulse-modulate the output of the first radio-frequency power supply 113, according to the received signals. The second pulse generator 204 generates a signal, which is used to pulse-modulate the output of the second radio-frequency power supply 109, according to the received signals. To maintain output synchronization between the first radio-frequency power supply 113 and the second radio-frequency power supply 109, a master clock generator 205 is provided. The oscillating frequency of the master clock generator 205 may be any value that is sufficiently higher than the pulse frequency. In this embodiment, the oscillating frequency is 400 kHz.

The output clock of the master clock generator 205 is sent to the first pulse generator 203 and the second pulse generator 204. By synchronizing the time at which the pulse waveform is generated with the output clock frequency of the master clock generator 205, the plasma modulation and the bias modulation are synchronized with each other. In addition, the output frequency of the master clock generator 205 is used also as the frequency of the second radio-frequency power supply 109. This means that the waveform obtained by multiplying the output of the second pulse generator 204 and the output of the master clock generator 205 is amplified by the second radio-frequency power supply 109 and is applied to the wafer 102.

Figure 3:
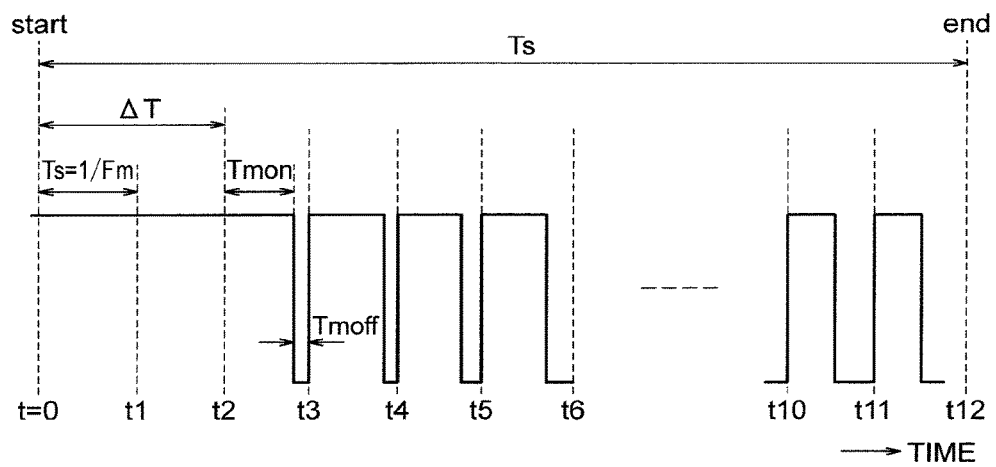
FIG. 3 is a diagram showing the pulse waveform for modulating a first radio-frequency power.

Next, a pulse waveform 206, used to modulate the radio-frequency power supplied from the first radio-frequency power supply 113, is described with reference to FIG. 3. In the pulse waveform in FIG. 3 and in the operation description below, the numeric values are simplified for the sake of description. FIG. 3 shows the pulse waveform where the etching time Ts is 6 seconds, the temporal change increment Td is 1 second, the microwave modulation frequency Fm is 0.5 Hz, the start-time duty ratio Dms is 100%, and the end-time duty ratio Dme is 50%.

According to this recipe, the microcomputer 201 reduces the duty ratio from 100% to 50% in proportion to time in six stages (Ts/Td=6). That is, based on this recipe, the microcomputer 201 calculates the duty ratio reduction rate of 10% per second. Because the pulse frequency Fm is 0.5 Hz, two pulses are generated during Td that is one second. That is, the pulse waveform with the duty ratio of 100% is generated twice in the first one second, the pulse with the duty ratio of 90% is generated twice in the next one second, and the pulse with the duty ratio of 80% is generated twice in the next one second. The same pulse generation is repeated and, finally, the pulse with the duty ratio of 50% is generated twice in the last one second. Then, the pulse generation is terminated.

According to this pulse, the magnetron 106 turns on or off the output of microwaves. The radio-frequency power Pm during the on period of the magnetron is input as a separate recipe. For example, when Pm is set to 1000 W, the average radio-frequency power is reduced from 1000 W to 500 W in increments of 100 W in six seconds. The average radio-frequency power is a value calculated as the product of Pm and the duty ratio.

The above-described operation is performed for the modulation of the radio-frequency power supplied from the first radio-frequency power supply 113. The same operation is performed for the modulation of the radio-frequency power supplied from the second radio-frequency power supply 109. The radio-frequency power supplied from the first radio-frequency power supply 113 and the radio-frequency power supplied from the second radio-frequency power supply 109 can be controlled independently of each other. Therefore, the radio-frequency power supplied from the second radio-frequency power supply 109 may be continuously output without pulse modulation.

Table 1 shows the measurement result of discharge stability when the microwave power is changed within the etching time as described above. Table 1 evaluates a change in visually inspected plasma emission intensity in terms of flickering levels. The gas is a mixed gas of $Cl_2$ gas, $O_2$ gas, and HBr gas with the pressure of 0.5 Pa. The table shows that the discharge is stable in all regions when the microwave power is changed by changing the duty ratio with Pm set to 1000 W. On the other hand, the table shows that the discharge becomes unstable from 700 W to 800 W when Pm is decreased as in the conventional method. That is, high-precision etching cannot be accomplished in the conventional method.

Pm may be changed with the duty ratio if set to a value in a range in which the discharge is stable during continuous discharge time. The microwave power that is unstable in discharge depends on the discharge condition such as the gas type and the pressure and, therefore, the stability of discharge must be measured at each discharge time.

TABLE 1

| Average power (W) | 1000 | 900 | 800 | 700 | 600 | 500 |
|---|---|---|---|---|---|---|
| Continuous output | ○ | ○ | Δ | x | ○ | ○ |
| Duty ratio controlled by pulse modulation | ○ | ○ | ○ | ○ | ○ | ○ | where ○ indicates that the discharge is stable, Δ indicates that the discharge flicker is low, and x indicates that the discharge flicker is high.

Not only the pulse waveform but also the output of a first power on/off signal generator 207 is input to the first radio-frequency power supply 113. Similarly, not only the pulse waveform but also the output of a second power on/off signal generator 208 is input to the second radio-frequency power supply 109. These signals are provided to ensure safety. That is, even if an abnormal condition occurs in the power control unit 114 and the on signal is output continuously from the first pulse generator 203 and the second pulse generator 204, these signals are input to disconnect the power independently of such a condition.

The first on/off signal generator 207 receives the etching time information from a source different from the recipe to control the on/off of the first radio-frequency power supply 113. The first radio-frequency power supply 113 outputs the radio-frequency power only when the pulse from the first pulse generator 203 is on and the signal from the first on/off signal generator 207 is on. The second on/off signal generator 208 receives the etching time information from a source different from the recipe to control the on/off of the second radio-frequency power supply 109. The second radio-frequency power supply 109 outputs the radio-frequency power only when the pulse from the second pulse generator 204 is on and the signal from the second on/off signal generator 208 is on. Such a configuration can prevent an etching abnormality and damage to the plasma etching apparatus.

First Embodiment

An actual embodiment of the plasma etching method according to the present invention is described below. The plasma etching processing in this embodiment is performed using the microwave ECR plasma etching apparatus shown in FIG. 1. In the example in this embodiment, a polysilicon (Poly-Si) gate is formed by plasma etching.

Figure 4D:
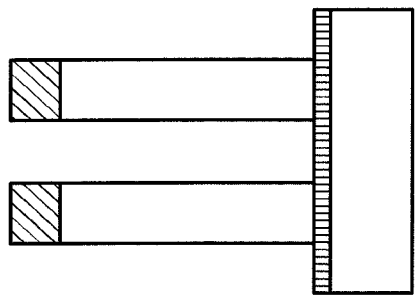
FIGS. 4A-4D are diagrams showing plasma etching results in a first embodiment.
Figure 4C:
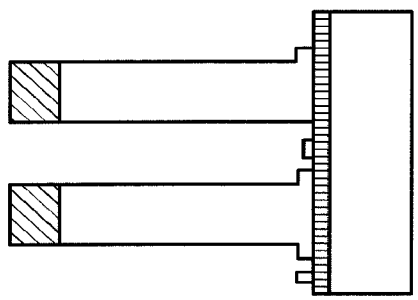
Figure 4B:
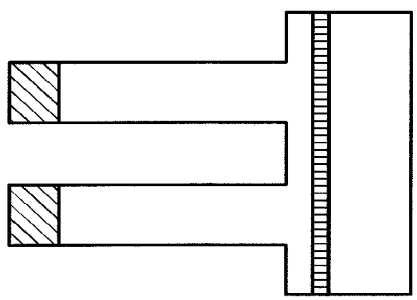
Figure 4A:
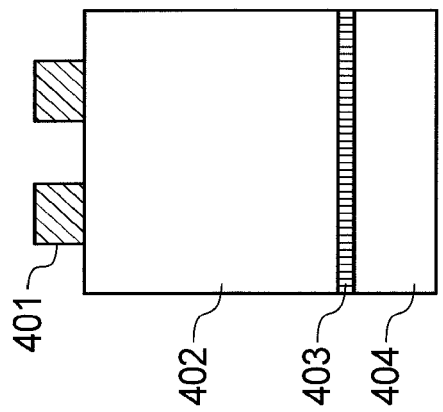

As shown in FIG. 4A, the polysilicon gate before etching has a structure composed of a silicon film 401 including nitrogen as the first film, a polysilicon film 402 as the second film, an oxide film 403 as the third film, and a silicon substrate 404 as the fourth film, laminated from top to bottom in this order. The silicon film 401 including nitrogen, which is the first film, is used as a mask patterned in advance according to a groove pattern of a desired size.

First, the polysilicon film 402 is etched to the depth, at which the oxide film 403 is not exposed, with the silicon film 401 including nitrogen as the mask as shown in FIG. 4B according to the first-step etching condition such as the one shown in Table 2.

TABLE 2

| | |
|---|---|
| Etching time | 10 seconds |
| $Cl_2$ gas | 140 ml/min |
| $O_2$ gas | 16 ml/min |
| HBr gas | 140 ml/min |
| Ar gas | 57.6 ml/min |
| $CH_4$ gas | 2.4 ml/min |
| Processing pressure | 0.6 Pa |
| Microwave power | 750 W |
| Bias power | 120 W |

In the second step, the microwave average power is set to 1000 W for the first 10 seconds with the microwave power and the duty ratio during the pulse modulation on period set to 1000 W and 100%, respectively, as shown in Table 3. For the next 10 seconds, the microwave average power is set to 900 W with the microwave power and the duty ratio during the pulse modulation on period set to 1000 W and 90%, respectively. In addition, for the succeeding next 10 seconds, the microwave average power is set to 800 W with the microwave power and the duty ratio during the pulse modulation on period set to 1000 W and 80%, respectively.

In this manner, the duty ratio is reduced sequentially for each 10 seconds with the microwave power during the pulse modulation on period maintained at 1000 W. For the last 10 seconds, the microwave average power is set to 500 W with the microwave power and the duty ratio during the pulse modulation on period set to 1000 W and 50%, respectively. By sequentially reducing the microwave average power from 1000 W to 500 W for each 10 seconds while adjusting the duty ratio in this manner, the remaining film of the polysilicon film 402 is etched after the first step.

TABLE 3

| | |
|---|---|
| Etching time | 60 seconds |
| Microwave pulse modulation frequency Fm | 1000 Hz |
| Temporal change increment Td | 10 seconds |
| Start-time duty ratio Dms | 100% |
| End-time duty ratio Dme | 50% |
| $O_2$ gas | 5 ml/min |
| HBr gas | 190 ml/min |
| Ar gas | 48 ml/min |
| $CH_4$ gas | 2 ml/min |
| Processing pressure | 0.35 Pa |
| Microwave power during pulse modulation on period | 1000 W |
| Bias power | 40 W |

FIG. 4D shows the result of etching in the first step and the second step. As shown in FIG. 4D, the etching is performed with no part of the oxide film 403 removed, with no effect on the throughput, and with no etching residue. This effect is achieved for the following reason.

The condition for the second step described above requires that the selectivity with respect to the oxide film 403 be high. Therefore, when the etching is performed according to the etching condition in which the microwave power is reduced in stages from 1000 W to 500 W every 10 seconds with the duty ratio maintained at 100% as shown in Table 4, a part of the polysilicon film 402 remains unetched as shown in FIG. 4C. In this condition, to increase the selectivity with respect to the oxide film 403, the microwave power is reduced in stages for the following reason. That is, when the etching is performed with the microwave power of 1000 W only, it is difficult to prevent a part of the oxide film 403 from being removed; conversely, when the etching is performed with the microwave power of 500 W only, it is efficient to prevent a part of the oxide film 403 from being removed but the etching rate becomes lower with an adverse effect on the throughput. That is, the etching is performed as described in first step and the second step because the microwave power is reduced in stages to prevent a part of the oxide film 403 from being removed and, at the same time, to prevent the throughput from being affected.

TABLE 4

| | |
|---|---|
| Etching time | 60 seconds |
| $O_2$ gas | 5 ml/min |
| HBr gas | 190 ml/min |
| Ar gas | 48 ml/min |
| $CH_4$ gas | 2 ml/min |
| Processing pressure | 0.35 Pa |
| Microwave power | 1000 W to 500 W (100 W pitch) |
| Bias power | 40 W |

The probable reason that the polysilicon film 402 cannot be removed completely as shown in FIG. 4C is that the discharge becomes unstable as shown in Table 1 while the microwave power is reduced and, therefore, the etching does not progress. On the other hand, in the case of the second step shown in Table 3, the microwave average power is reduced in stages by controlling the duty ratio, meaning that the microwave power during the pulse modulation on period in the second step is maintained at 1000 W. The discharge becomes stable when the microwave power is 1000 W because the microwave power of 1000 W is a microwave power value in the discharge stable region as shown in Table 1.

For this reason, the discharge in the second step using the values, such as those shown in Table 3, continues to be stable even when the microwave average power is reduced in stages. Performing the etching in the second step using the values, such as those shown in Table 3, allows the etching profile to be obtained as shown in FIG. 4D.

This embodiment provides a plasma processing method for use in gradually changing the microwave power over time. This method controls the microwave average power in such a way that the microwave power is pulse-modulated and the duty ratio is changed with the microwave power value during the pulse modulation on period set to a value in a region where the plasma becomes stable. This embodiment can change the microwave average power gradually while maintaining the plasma in a stable state, thus ensuring stable, precise etching.

Second Embodiment

The conventional technology applies mainly to MEMS as described in JP-A-2009-239054. Therefore, the processing size is about 0.5 μm that is larger than the processing size of a semiconductor device where the processing size is at the level of 20 to 30 nm. Of course, the present invention can be applied to MEMS and also to micro etching of 20 nm or smaller. In this embodiment, an example of application to the etch back process is described in which the etch back process is performed for an oxide film that is embedded in a silicon groove with an aspect ratio of 8 and a width of 20 nm.

Recently, three-dimensional structure transistors, such as Fin-FET, are fabricated on a commercial basis. The fabrication process of a three-dimensional structure transistor is largely different from that of a conventional planar type transistor. Therefore, the etching of the three-dimensional structure transistor requires technologies not used in the conventional etching. Among those technologies is the etch-back of a groove pattern with a minute width and a high aspect ratio. This embodiment provides a method for satisfying a need to remove an oxide film, embedded in a groove with a minute width and a high aspect ratio, without etching the silicon.

A gas that enables a fine adjustment of etching components and the deposit components is suitable for this etching. A mixed gas of $CHF_3$ gas, $H_2$ gas, and CO gas or a mixed gas of $C_2F_6$ gas, $H_2$ gas, and CO gas is used for this gas. The CO gas contained in this mixed gas may be $CO_2$ gas. A noble gas such as Ar gas, Xe gas, and Kr gas or N2 gas may be added to this mixed gas. A mixed gas of Ar gas, $CHF_3$ gas, CO gas, and $H_2$ gas is used in this embodiment with the pressure of 0.5 Pa as shown in Table 5. "Toe" in Table 5 indicates an over-etching time. In this embodiment, over-etching is performed for 30 seconds while maintaining the final duty ratio state.

TABLE 5

| | |
|---|---|
| Etching time Ts | 360 seconds |
| Temporal change increment Td | 7.2 seconds |
| Over-etching time Toe | 30 seconds |
| Microwave pulse modulation frequency Fm | 1000 Hz |
| Microwave power start-time duty ratio Dms | 100% |
| Microwave power end-time duty ratio Dme | 51% |
| Bias pulse modulation frequency Fb | 1000 Hz |
| Bias power start-time duty ratio Dbs | 20% |
| Bias power end-time duty ratio Dbe | 49% |
| Ar gas | 200 ml/min |
| $CHF_3$ gas | 40 ml/min |
| CO gas | 10 ml/min |
| $H_2$ gas | 10 ml/min |
| Processing pressure | 0.5 Pa |
| Microwave power during pulse modulation on period | 800 W |
| Bias power during pulse modulation on period | 200 W |

Figure 5:
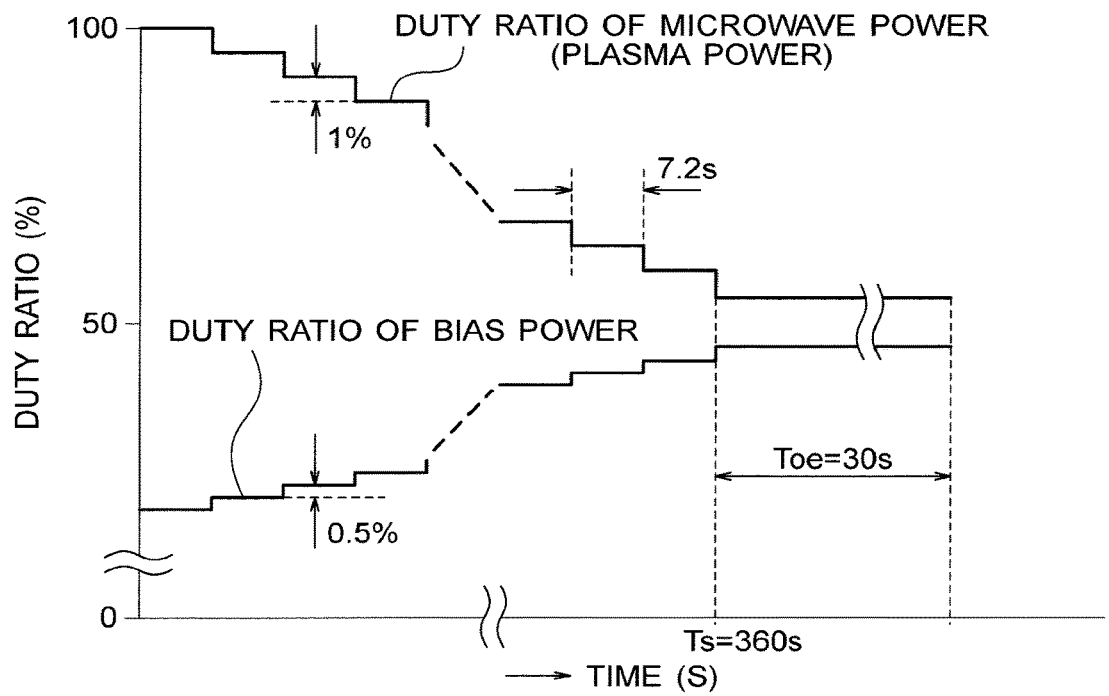
FIG. 5 is a diagram showing a duty-ratio control method according to the present invention.

The microwave power during the pulse modulation on period is set to the microwave power of 800 W, and the duty ratio is changed from 100% (start time) to 51% (end time) for the duration of etching time of 360 seconds, which is the etching time Ts, at an interval of 7.2 seconds. The bias power during the pulse modulation on period is set to the bias power of 200 W, and the duty ratio is changed from 20% (start time) to 49% (end time) at the same time interval as that of the microwave power. FIG. 5 shows a change in the microwave power, bias power, and duty ratios over time.

Figures 6A, 6B, 6C:
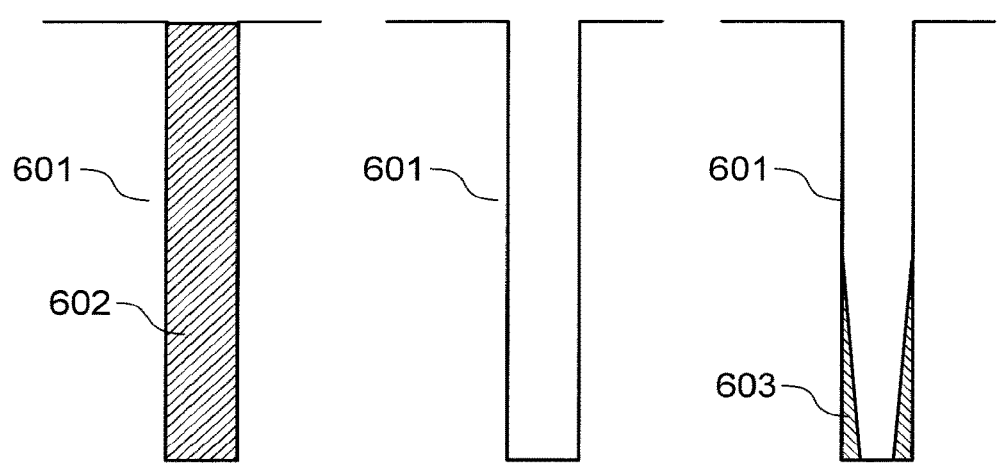
FIGS. 6A-6C are diagrams showing plasma etching results in a second embodiment.

The duty ratio of the microwave power is decreased 1% every 7.2 seconds, and the microwave average power is decreased from 800 W to 408 W. On the other hand, the duty ratio of the bias power is increased 0.5% every 7.2 seconds, and the bias average power is increased from 16 W to 98 W. As a result of etching performed as shown in Table 5, a desired etching profile, such as the one shown in FIG. 6B, is obtained. FIG. 6A is a cross section of a before-etching oxide film 602 embedded in a silicon groove 601.

On the other hand, when the etching is performed without changing the duty ratio from the start-time state, an etching residue 603, which cannot be removed even if the etching time is extended, is generated as shown in FIG. 6C. This is because, as the etching progresses and the aspect ratio of the groove becomes gradually higher, the higher attachment-coefficient radicals in the plasma (for example, CHx, CHFx) accumulate near the opening of the groove before the radicals reach the bottom of the groove. This makes it difficult to maintain the characteristics similar to those at the etching start time.

Therefore, it is more efficient to increase the processing precision by changing the plasma dissociation or the bias energy according to a change in the etching profile during the etching as in this embodiment. In this embodiment, the microwave average power is reduced as the time elapses to prevent the dissociation of plasma. That is, high-aspect-ratio etching is realized by reducing the ratio of high attachment-coefficient radicals that are generated as the dissociation progresses and by gradually increasing the bias average power to allow ion to reach the bottom of the groove.

Because an increase or a decrease in the microwave power and the bias power depends on the gas that is used and on the etching profile, the present invention is not limited to this embodiment. In addition, the bias power of an ECR type plasma etching apparatus plays a role in controlling the profile and the selectivity rather than in making an unstable discharge stable. Therefore, the control can be performed in such a way that the power during the pulse modulation on period is changed with the duty ratio kept constant. Changing the microwave power and the bias power, as well the gas pressure and the gas composition, increases the precision of etching.

Although the etching time is set in advance in the above embodiments, the end point of etching is sometimes detected by a change in the light emission intensity of the byproducts in the plasma. In this case, it is possible to determine the end point of etching by setting, not the etching time Ts, but the temporal change increment Td and the duty ratio change amount and, by changing the duty ratio, to determine the etching end time based on the light emission intensity. It is also possible to change the duty ratio for a time shorter than the time to the expected end time of etching and, after that, maintain a fixed duty ratio so that, during this period, the end point of the etching can be detected by the light emission intensity. In addition, it is also possible to change the mixture ratio of the etching gas as the time elapses by mixing two or more noble gases, which have different ionization energies, with the etching gas.

Third Embodiment

Next, a solution to charging damage, one of the problems at plasma etching time, is described. For example, the oxide film 403 shown in FIGS. 4A to 4D is an etch stop layer such as an interlayer insulator film, a charging damage problem is not generated. When forming a gate electrode, the oxide film 403 corresponds to a gate insulator film. An excessive voltage, when applied to the gate insulator film, generates a dielectric breakdown, causing charging damage.

When the discharge is pulse modulated, the plasma density rapidly changes. At this time, when the discharge is switched from on to off with the bias voltage applied to the wafer, the voltage applied to the wafer increases and occurs as a spike as the plasma density rapidly decreases. The voltage that occurs as a spike in this manner is applied to the gate insulator film, and charging damage is sometimes generated.

To prevent this charging damage, it is necessary to synchronize the on/off of the plasma with the on/off of the bias and, at the same time, to prevent the bias from being turned on when the plasma is off. For example, as shown in FIG. 5, it is necessary to temporally change the duty ratio so that the duty ratio of the bias power is always kept lower than the duty ratio of the microwave power and that the bias is not turned on when the plasma is off.

Fourth Embodiment

The phenomenon that the etching rate decreases in a high-aspect-ratio groove or hole is known generally as a Reactive Ion Etch-lag (hereinafter called an RIE-lag). This phenomenon is a bottleneck in the processing of patterns with different aspect ratios. In this embodiment, an example in which the present invention is applied to improve an RIE-lag is described.

When the duty ratio of the pulse-modulated plasma is changed as the etching time elapses, the etching rate is also changed during the etching. This change, if combined with an RIE-lag, makes the etching rate change more complex, sometimes making it difficult to control the etch profile. This means that, even when the duty ratio is changed, the etching rate change should preferably be reduced. To realize this, it is necessary to control the increase/decrease in the duty ratio of the plasma power and the increase/decrease in the duty ratio of the bias power so that these duty ratios change in the opposite directions as the time elapses.

For example, when the duty ratio of the plasma power is decreased (that is, the etching rate is decreased) as the time elapses as shown in FIG. 5, the bias power is changed in the increasing direction (that is, the etching rate is increased) to offset the decrease in the etching rate. On the other hand, when the duty ratio of the plasma power is increased, the duty ratio of the bias power is changed in the decreasing direction to offset the change in the etching rate.

Fifth Embodiment

Next, another embodiment is described below in which the method for changing the duty ratio as the time elapses is different from that in the embodiment described above. Although an example is described in the fourth embodiment in which the present invention is applied to reduce an RIE-lag, the emphasis is sometimes placed on the characteristics other than an RIE-lag depending upon the application.

Figure 7:
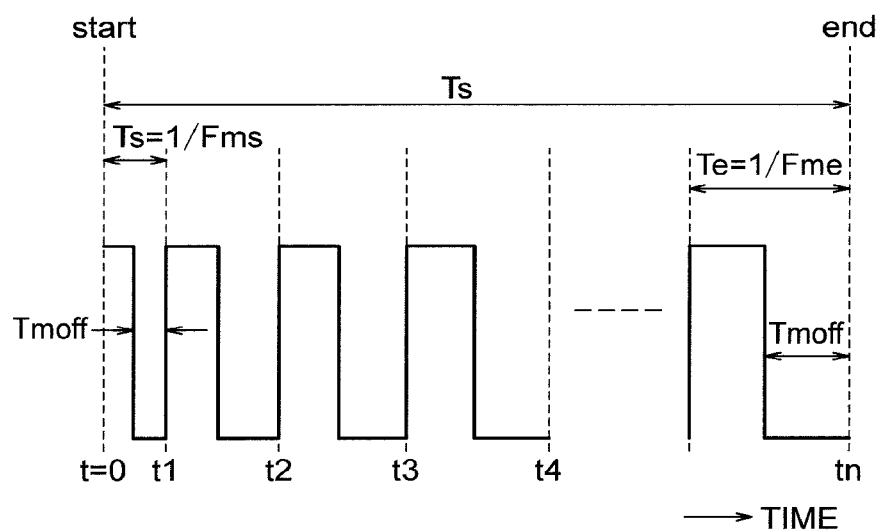
FIG. 7 is a diagram showing an example in which the duty ratio is controlled by changing the pulse rate of pulse modulation.

For example, when the plasma off period (Tmoff) is extended as the time elapses with the plasma on period (Tmon) kept to a fixed value as shown in FIG. 7 (that is, the pulse modulation frequency is decreased), the etching rate may be reduced with the plasma on-state maintained at a fixed level.

Normally, there is a time lag between the time the microwave power is turned on to the time the plasma density becomes stable. When the plasma on-time period Tmon is changed, the ratio of Tlag (time required for the plasma density becomes stable) to the plasma on period (Tlag/Tmon) is changed with the result that the plasma state in the plasma on period is changed. Therefore, when more stable etching is required, it is necessary to change the duty ratio by changing Tmoff with Tmon kept constant to allow the etching rate to be changed reproducibly.

This method is conveniently used to gradually decrease the etching rate to ensure etching continuity when the etching is almost terminated (main etching) and the operation is switched to the removal of a small amount of residues (over-etching). The method in this embodiment may also be used to prevent a difference in the profile level when the plasma is changed sharply in a stepwise manner and the problem of a difference in the profile level is generated. In addition, the method for changing the duty ratio by changing the on period with the off period kept constant is suitable when the etching rate is changed by the plasma that is an accumulative gas wherein the radical accumulation of this gas in the off period is more dominant than the plasma state in the on period.

This embodiment is applicable to both the pulse modulation of the microwave power and the pulse modulation of the bias power.

Sixth Embodiment

In the embodiments described above, the optimal condition for the setting values, such as a duty ratio, is determined according to the condition evaluation performed in advance, and the determined condition is applied to the mass production. On the other hand, when an etching depth is measured by a film thickness measurement instrument in real time using interference or when the correlation between the measurement value of a plasma impedance measurement instrument and an etching profile is calculated in advance, the duty ratio is controlled so that, while measuring the etching depth or the plasma impedance, at least one of the etching depth measurement value and the impedance measurement value becomes a desired value. If performed based on this duty ratio control in such a way that the plasma dissociation state is controlled, the feedback control ensures the etching of predetermined quality even if the plasma environment such as the in-chamber state changes over time.

As described above, to obtain a desired plasma processing result, the present invention gradually controls the duty ratio of at least one of the pulse modulation of the radio-frequency power for generating plasma and the pulse modulation of the bias power as the plasma processing time elapses. By performing this control, the present invention gradually controls the plasma dissociation state as the plasma processing time elapses.

In the example described in the second embodiment, the duty ratio of the pulse modulation of the radio-frequency power for generating plasma is gradually decreased as the plasma processing time elapses and the duty ratio of the pulse modulation of the bias power is gradually increased as the plasma processing time elapses. If a gas different from the gas in the second embodiment is used, the plasma dissociation state can be controlled to create a desired state by gradually increasing the duty ratio of the pulse modulation of the radio-frequency power for generating plasma as the plasma processing time elapses and by gradually decreasing the duty ratio of the pulse modulation of the bias power as the plasma processing time elapses.

The duty ratio may be controlled by one of the following two means: one is means for controlling the duty ratio by changing the on period or the off period with the pulse rate of the pulse modulation as a fixed pulse rate and the other is means for controlling the duty ratio by changing the pulse rate of the pulse modulation with the on period or off period of the pulse modulation as a fixed period.

In addition, the present invention performs feedback control for controlling the dissociation state of plasma by controlling the duty ratio based on an etching depth or plasma characteristics.

By changing the dissociation state of plasma, that is, by changing the level of dissociation of etching gas or the plasma density according to the present invention, the ratio between the radicals contributing to etching and the radicals contributing to accumulation and its attachment coefficient may be changed. The radicals during etching repeatedly attach on, or collide with, the side walls of minute grooves or holes of a semiconductor, reach the bottom, and contribute to the etching or the accumulation of the bottom part. When the attachment coefficient is changed, the depth at which the radicals can reach or the distribution of attachment on the side walls is changed. The depth at which the radicals can reach and the distribution of the attachment amount on the side walls determine the etching profile. Therefore, by changing the dissociation state of plasma according to a change in the etching profile over time, the optimum plasma state according to the profile can be controlled.

One of the application methods of the present invention is that the etching condition is optimized on a trial-and-error basis by etching a sample wafer in advance and then the optimized condition is applied to the mass production. Another application method is that the etching depth or the plasma change is monitored and, based on the monitored state, the method is applied in real time so that the dissociation state is changed.

Although application examples of an ECR type microwave plasma etching apparatus, which uses microwaves, have been described in the embodiments above, the present invention is not limited to those embodiments. The present invention may be applied also to a plasma etching apparatus that uses capacitively-coupled type or inductively-coupled type plasma generation means.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A plasma processing apparatus comprising:
   a plasma processing chamber to contain a sample to be processed;
   a first radio-frequency power supply to supply a first radio-frequency power to generate plasma;
   a second radio-frequency power supply to supply a second radio-frequency power to a sample stage configured to support the sample;
   a first pulse generator to generate a first pulse to modulate the first radio-frequency power; and
   a control unit configured to retain the first radio-frequency power during an on-period of the first pulse unchanged and monotonously increase or decrease sequentially in steps a duty ratio of the first pulse as a plasma processing time elapses commencing from when the plasma processing is started and until when the plasma processing is finished.

2. The plasma processing apparatus according to claim 1, wherein the power control unit is configured to control the duty ratio based at least in part on an etching profile of the sample.

3. The plasma processing apparatus according to claim 1, wherein the power control unit is configured to control the first radio-frequency power supply to supply the first radio-frequency power during an active period of the first pulse to generate plasma.

4. The plasma processing apparatus according to claim 1, further comprising:
   a second pulse generator to generate a second pulse to modulate the second radio-frequency power, wherein the power control unit is configured to control the second pulse to have an active period corresponding to an active period of the first pulse.

5. The plasma processing apparatus according to claim 4, wherein the control unit monotonously decreases the duty ratio of the first pulse as the plasma processing time elapses, and monotonously increases the duty ratio of the second pulse as the plasma processing time elapses.

6. The plasma processing apparatus according to claim 4, wherein the control unit monotonously increases the duty ratio of the first pulse as the plasma processing time elapses, and monotonously decreases the duty ratio of the second pulse as the plasma processing time elapses.

7. A plasma processing apparatus comprising:
   a plasma processing chamber to contain a sample to be processed;
   a first radio-frequency power supply to supply a first radio-frequency power to generate plasma;
   a second radio-frequency power supply to supply a second radio-frequency power to a sample stage configured to support the sample;
   a first pulse generator to generate a first pulse to time-modulate the first radio-frequency power; and
   a control unit configured to retain the first radio-frequency power during an on-period of the first pulse unchanged and monotonously change a duty ratio of the first pulse sequentially in steps from a first predetermined value to a second predetermined value as a plasma processing time elapses commencing from when the plasma processing is started and until when the plasma processing is finished.

8. The plasma processing apparatus according to claim 7, wherein the first predetermined value is smaller than the second predetermined value.

9. The plasma processing apparatus according to claim 7, wherein the first predetermined value is larger than the second predetermined value.

10. The plasma processing apparatus according to claim 7, further comprising:
    a second pulse generator to generate a second pulse to time-modulate the second radio-frequency power, wherein the control unit monotonously decreases the duty ratio of the first pulse as the plasma processing time elapses, and monotonously increases the duty ratio of the second pulse as the plasma processing time elapses.

11. The plasma processing apparatus according to claim 7, further comprising:
    a second pulse generator to generate a second pulse to time-modulate the second radio-frequency power, wherein the control unit monotonously increases the duty ratio of the first pulse as the plasma processing time elapses, and monotonously decreases the duty ratio of the second pulse as the plasma processing time elapses.

* * * * *